(12) United States Patent
Chung et al.

(10) Patent No.: US 11,824,067 B2
(45) Date of Patent: Nov. 21, 2023

(54) DISPLAY APPARATUS AND METHOD OF MANUFACTURING THE SAME

(71) Applicant: Samsung Display Co., Ltd., Yongin-si (KR)

(72) Inventors: Yunmo Chung, Yongin-si (KR); Daewoo Lee, Yongin-si (KR); Ilhun Seo, Yongin-si (KR); Hojin Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/352,357

(22) Filed: Jun. 21, 2021

(65) Prior Publication Data

US 2021/0343756 A1   Nov. 4, 2021

Related U.S. Application Data

(63) Continuation of application No. 16/846,240, filed on Apr. 10, 2020, now Pat. No. 11,056,511, which is a (Continued)

(30) Foreign Application Priority Data

Jan. 25, 2018  (KR) ........................ 10-2018-0009607

(51) Int. Cl.
*H01L 27/12*       (2006.01)
*H01L 27/146*     (2006.01)
(Continued)

(52) U.S. Cl.
CPC ........ *H01L 27/1251* (2013.01); *H01L 27/124* (2013.01); *H01L 27/1233* (2013.01);
(Continued)

(58) Field of Classification Search
CPC ..... H01L 21/823412; H01L 21/823437; H01L 27/1233; H01L 27/124; H01L 27/1248;
(Continued)

(56) References Cited

U.S. PATENT DOCUMENTS 6,307,264 B1   10/2001   Fukumoto
6,682,963 B2    1/2004   Ishikawa et al.
(Continued)

FOREIGN PATENT DOCUMENTS

CN    106711178    5/2017
EP      0768710    4/1997
(Continued)

OTHER PUBLICATIONS

EP Search Report dated Mar. 24, 2019 in EP Patent Application No. 19153798.
(Continued)

*Primary Examiner* — Cheung Lee
(74) *Attorney, Agent, or Firm* — H.C. Park & Associates, PLC

(57) ABSTRACT

A display apparatus including a first thin film transistor including a first active layer, and a second thin film transistor disposed on the first thin film transistor and including a second active layer, in which a material of the first active layer is different from a material of the second active layer, and a channel area of the second active layer overlaps a channel area of the first active layer.

12 Claims, 15 Drawing Sheets

Related U.S. Application Data continuation of application No. 16/257,693, filed on Jan. 25, 2019, now Pat. No. 10,629,626.

(51) Int. Cl.
    *H10K 59/126*     (2023.01)
    *H10K 59/121*     (2023.01)

(52) U.S. Cl.
    CPC ...... *H01L 27/1248* (2013.01); *H01L 27/1255* (2013.01); *H01L 27/1259* (2013.01); *H01L 27/14603* (2013.01); *H10K 59/126* (2023.02); *H10K 59/1213* (2023.02)

(58) Field of Classification Search
    CPC ............ H01L 27/1251; H01L 27/1255; H01L 27/1259; H01L 27/14603; H01L 27/3262; H01L 27/3272; H01L 29/786; H01L 29/78645; H01L 29/7869; H01L 29/78696; G02F 1/1368; G02F 1/13685; H10K 50/84

See application file for complete search history.

(56) References Cited

U.S. PATENT DOCUMENTS

| | | | |
|---|---|---|---|
| 9,443,872 B2 | 9/2016 | Miyairi | |
| 9,564,482 B2 | 2/2017 | Teraguchi et al. | |
| 10,263,117 B2 | 4/2019 | Ito et al. | |
| 2002/0030189 A1 | 3/2002 | Ishikawa | |
| 2006/0237725 A1 | 10/2006 | Jeong et al. | |
| 2006/0267100 A1 | 11/2006 | Noguchi et al. | |
| 2013/0328945 A1* | 12/2013 | Kim | ............ G09G 3/36 349/42 |
| 2014/0246653 A1 | 9/2014 | Wu | |
| 2014/0299842 A1 | 10/2014 | Kim et al. | |
| 2015/0108438 A1 | 4/2015 | Kim | |
| 2016/0005872 A1* | 1/2016 | Kurata | ............ H01L 29/785 257/43 |
| 2016/0035800 A1 | 2/2016 | Hsieh et al. | |
| 2016/0064421 A1 | 3/2016 | Oh et al. | |
| 2016/0380007 A1 | 12/2016 | Miyairi | |
| 2017/0162640 A1 | 6/2017 | Lee | |
| 2017/0256569 A1 | 9/2017 | Ohara | |
| 2019/0189723 A1 | 6/2019 | Kim et al. | |

FOREIGN PATENT DOCUMENTS

| | | |
|---|---|---|
| JP | 2000-258796 | 9/2000 |
| JP | 2002-164354 | 6/2002 |
| JP | 2013-225620 | 10/2013 |
| JP | 2015-046606 A | 3/2015 |
| JP | 2015-159280 | 9/2015 |
| JP | 2015-188070 | 10/2015 |
| JP | 2015-194577 | 11/2015 |
| JP | 2016-167591 | 9/2016 |
| JP | 2017-162852 | 9/2017 |
| KR | 10-2011-0071698 | 6/2011 |
| KR | 10-2014-0120736 | 10/2014 |
| KR | 10-2015-0046646 | 4/2015 |
| KR | 10-2016-0043327 | 4/2016 |
| KR | 10-2017-0026900 | 3/2017 |
| KR | 10-2017-0065069 | 6/2017 |

OTHER PUBLICATIONS

Notice of Allowance dated Dec. 12, 2019, in U.S. Appl. No. 16/257,693.

Non-Final Office Action dated Nov. 23, 2020, issued to U.S. Appl. No. 16/846,240.

Notice of Allowance dated Mar. 3, 2021, issued to U.S. Appl. No. 16/846,240.

* cited by examiner

DISPLAY APPARATUS AND METHOD OF MANUFACTURING THE SAME

CROSS-REFERENCE TO RELATED APPLICATIONS

This application is a Continuation of U.S. patent application Ser. No. 16/846,240, filed on Apr. 10, 2020, which is a Continuation of U.S. patent application Ser. No. 16/257,693, filed Jan. 25, 2019, which claims priority from and the benefit of Korean Patent Application No. 10-2018-0009607, filed on Jan. 25, 2018, each of which is hereby incorporated by reference for all purposes as if fully set forth herein.

BACKGROUND

Field

Exemplary embodiments of the invention relate generally to a display apparatus and a method of manufacturing the same.

Discussion of the Background

Display apparatuses include a display device and electronic devices for controlling an electrical signal applied to the display device. The electronic devices include a thin film transistor (TFT), a capacitor, and a plurality of lines.

As the resolution of display apparatuses and the number of TFTs electrically connected to a single display device are increased, a pixel aperture ratio may be decreased.

The above information disclosed in this Background section is only for understanding of the background of the inventive concepts, and, therefore, it may contain information that does not constitute prior art.

SUMMARY

Devices constructed according to exemplary embodiments of the invention are capable of realizing high resolution.

Additional aspects will be set forth in part in the description which follows and, in part, will be apparent from the description, or may be learned by practice of the presented embodiments.

A display apparatus according to an exemplary embodiment includes a first thin film transistor disposed on a substrate and including a first active layer, a second thin film transistor disposed on the first thin film transistor and including a second active layer overlapping the first thin film transistor, a first planarization layer disposed between the first thin film transistor and the second thin film transistor, the first planarization layer including a first insulating layer and a second insulating layer disposed on the first insulating layer, and a first buffer layer disposed between the first planarization layer and the second thin film transistor, in which an upper surface of the second insulating layer and an upper surface of the first insulating layer are substantially flush with each other.

The first buffer layer may include silicon oxide.

The display apparatus may further include a conductive layer disposed between the first thin film transistor and the first planarization layer and overlapping the second active layer.

The conductive layer may be configured to be applied with a direct current (DC) voltage.

At least a light-emitting section of the conductive layer is configured to be applied with a DC voltage.

A size of the conductive layer may be larger than a size of the gate electrode of the second thin film transistor.

A center of the conductive layer may be shifted from a center of a gate electrode of the second thin film transistor a distance of less than 3 μm.

A thickness of the second active layer may be less than a thickness of the first active layer.

A thickness of the second active layer may be less than or equal to 80% of a thickness of the first active layer.

The display apparatus may further include a display device disposed on the second thin film transistor, the display device overlapping the second thin film transistor and connected to the first thin film transistor.

The display apparatus may further include, between the second thin film transistor and the display device, a second planarization layer including a third insulating layer and a fourth insulating layer disposed on the third insulating layer, and a second buffer layer on the second planarization layer, in which an upper surface of the fourth insulating layer and an upper surface of the third insulating layer are substantially flush with each other.

The display apparatus may further include a fifth insulating layer disposed between the second thin film transistor and the display device.

The second buffer layer may include silicon nitride.

The display apparatus may further include a third thin film transistor including a third active layer extending from the first active layer.

The display apparatus may further include a capacitor disposed on the second thin film transistor and at least partially overlapping the second active layer.

A method of manufacturing a display apparatus according to an exemplary embodiment includes forming a first thin film transistor including a first active layer on a substrate, forming, on the first thin film transistor, a first insulating layer and a second insulating layer, forming a first planarization layer by etching the second insulating layer such that an upper surface of the first insulating layer and an upper surface of the second insulating layer are substantially flush with each other, forming a first buffer layer on the first planarization layer, and forming a second thin film transistor on the first buffer layer, the second thin film transistor including a second active layer overlapping the first thin film transistor.

The method may further include performing thermal treatment on the first planarization layer and the first buffer layer before forming the second thin film transistor.

The method may further include forming a conductive layer overlapping the first active layer on the first thin film transistor, before forming the first and second insulating layers, in which the second thin film transistor may overlap the conductive layer.

The method may further include forming a display device on the second thin film transistor, the display device overlapping the second thin film transistor and connected to the first thin film transistor.

The method may further include, before the forming of the display device, forming, on the second thin film transistor, a third insulating layer and a fourth insulating layer, forming a second planarization layer by etching the fourth insulating layer such that an upper surface of the third insulating layer and an upper surface of the fourth insulating layer are substantially flush with each other, and forming a second buffer layer on the second planarization layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
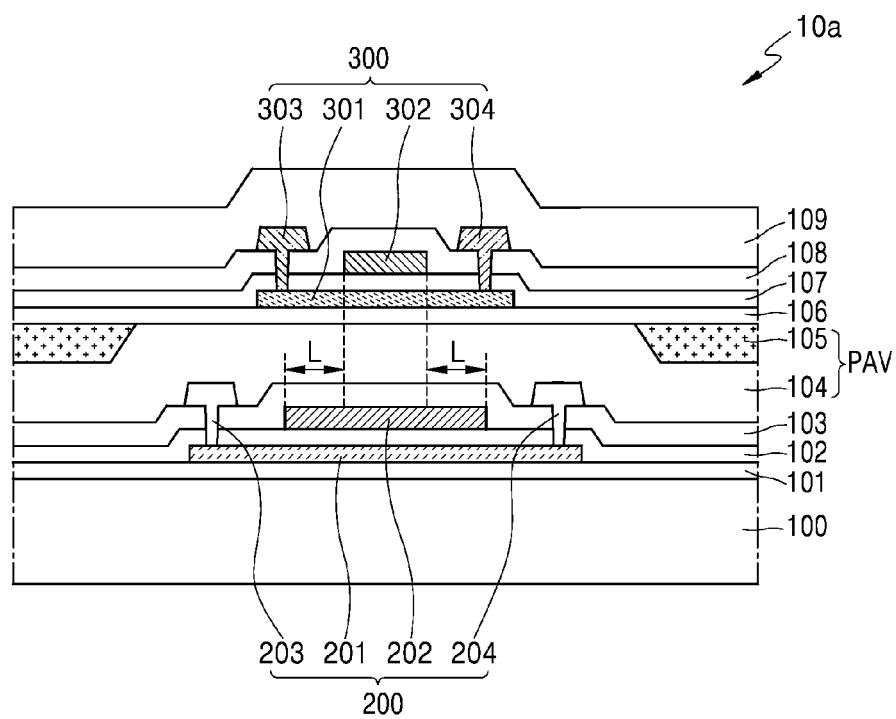
FIG. 1A is a cross-sectional view of a semiconductor device according to an exemplary embodiment.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
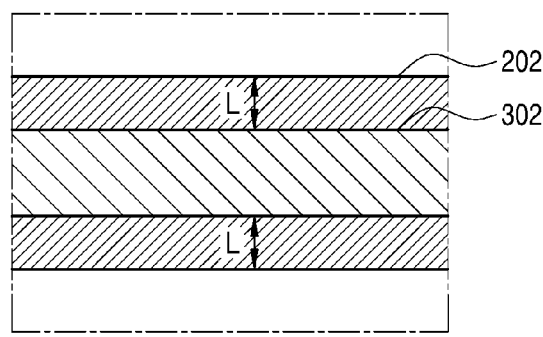
FIG. 1B is a plan view of a portion of the semiconductor device of FIG. 1A.

FIG. 1A is a cross-sectional view of a semiconductor device 10a according to an exemplary embodiment. FIG. 1B is a plan view of a portion of the semiconductor device 10a of FIG. 1A.

Referring to FIG. 1A, the semiconductor device 10a may include a first thin film transistor (TFT) 200 and a second TFT 300 on a substrate 100. The first TFT 200 and the second TFT 300 may be disposed on different layers, and thus, may at least partially overlap with each other in a cross-sectional view and in a plan view. The first TFT 200 may include a first active layer 201, a first gate electrode 202, a first source electrode 203, and a first drain electrode 204. The first active layer 201 may include a source region and a drain region contacting the first source electrode 203 and the first drain electrode 204, respectively, and a channel region between the source region and the drain region. The first TFT 200 may be disposed on a first buffer layer 101. According to an exemplary embodiment, the first buffer layer 101 may be omitted.

The second TFT 300 may include a second active layer 301, a second gate electrode 302, a second source electrode 303, and a second drain electrode 304. The second active layer 301 may include a source region and a drain region contacting the second source electrode 303 and the second drain electrode 304, respectively, and a channel region between the source region and the drain region.

At least a portion of the second active layer 301 may overlap the first active layer 201. A thickness of the second active layer 301 is less than that of the first active layer 201. As used herein, a thickness may refer to a distance measured in a vertical direction from a bottom surface thereof. The thickness of the second active layer 301 may be about 80% or less of the thickness of the first active layer 201. In this case, a lower limit of the thickness of the second active layer 301 may be determined according to the characteristics of the second TFT 300.

According to an exemplary embodiment, a line and/or an electrode below the second TFT 300 may be a line and/or an electrode that receive a constant direct current (DC) voltage. According to another exemplary embodiment, the line and/or the electrode below the second TFT 300 may be a line and/or an electrode that receive an alternating current (AC) voltage. In this case, a constant voltage may be applied to the line and/or the electrode that receive an AC voltage during at least a certain period of time. For example, a constant voltage may be applied to the line and/or the electrode that receive an AC voltage during a period that affects the brightness due to coupling with one electrode of the second TFT 300, such as each of at least a threshold voltage compensating time period, a data write time period, and a light-emitting time period.

The line and/or electrode below the second TFT 300 may have a greater size or area than the second gate electrode 302. At least one edge of the line and/or electrode below the second TFT 300 may extend beyond an edge of the second gate electrode 302 by a certain length. For example, an edge of the line and/or electrode below the second TFT 300 may extend beyond an edge of the second gate electrode 302 by 1.5 μm or more.

The first gate electrode 202 of the first TFT 200 may be an exemplary electrode disposed below the second TFT 300. FIG. 1B is a plan view illustrating a relationship between the first gate electrode 202 of the first TFT 200 and the second gate electrode 302 of the second TFT 300 in terms of location and size.

Referring to FIGS. 1A and 1B, an edge of the first gate electrode 202 may extend beyond an edge of the second gate electrode 302 by a certain length L. Although FIGS. 1A and 1B show that the first gate electrode 202 extends beyond the second gate electrode 302 in two opposing directions, the inventive concepts are not limited thereto. For example, at least one edge of the first gate electrode 202 may extend from an edge of the second gate electrode 302. The extending lengths L of the two end edges of the first gate electrode 202 may be different from each other.

A planarization layer PAV may cover the first TFT 200. The planarization layer PAV includes a third insulating layer 104 and a fourth insulating layer 105, and may be disposed between the first TFT 200 and the second TFT 300. The planarization layer PAV may have a structure of, in which two insulating layers are mixed by inserting the fourth insulating layer 105 into a portion of the third insulating layer 104. The planarization layer PAV may planarize an irregular shape of the third insulating layer 104, which may be caused by the first TFT 200.

The fourth insulating layer 105 may be disposed on a portion of the third insulating layer 104. An upper surface of the third insulating layer 104 and an upper surface of the fourth insulating layer 105 may be at approximately (or substantially) flush with each other, thereby forming an entirely-flat upper surface. As used herein, two surfaces being substantially flush with each other may refer that the two surfaces are disposed on the same plane or at the same level.

A second buffer layer 106 may be disposed on the planarization layer PAV. The second TFT 300 may be disposed on the second buffer layer 106.

Figure 2A:
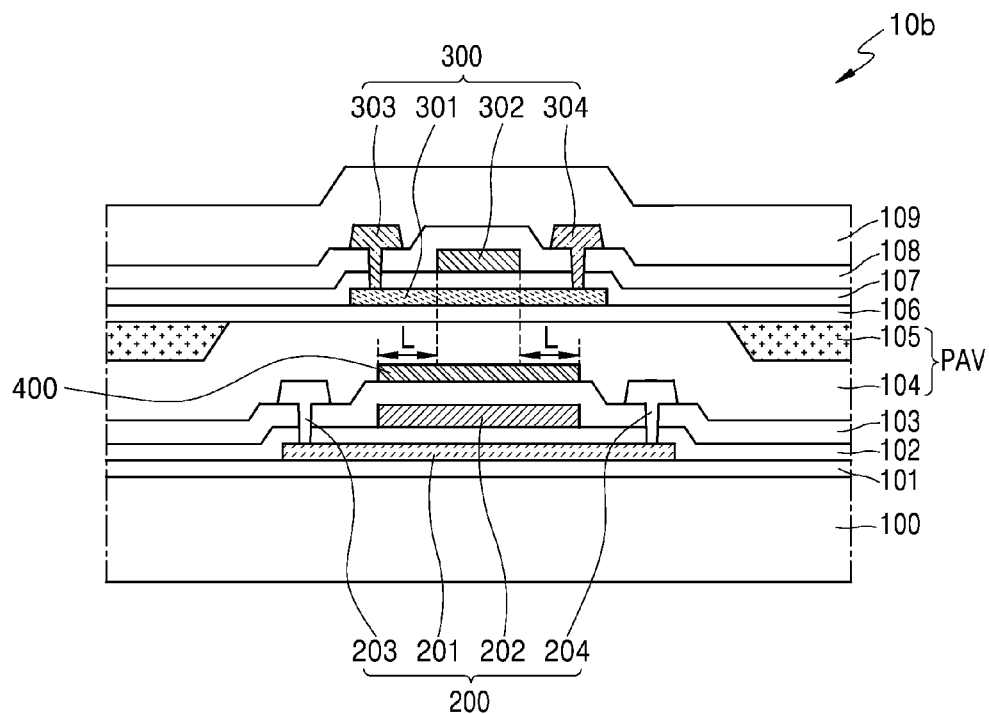
FIG. 2A is a cross-sectional view of a semiconductor device according to another exemplary embodiment.
Figure 2B:
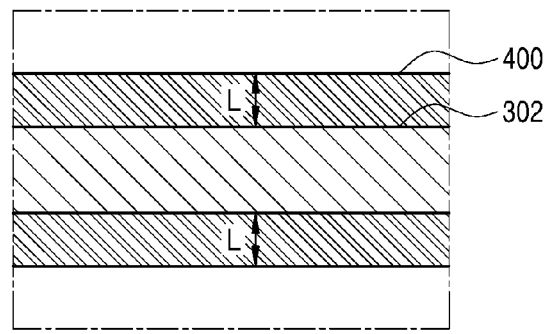
FIG. 2B is a plan view of a portion of the semiconductor device of FIG. 2A.

FIG. 2A is a cross-sectional view of a semiconductor device 10b according to another exemplary embodiment. FIG. 2B is a plan view of a portion of the semiconductor device 10b of FIG. 2A.

The semiconductor device 10b of FIG. 2A is different from the semiconductor device 10a of FIG. 1A in that a conductive layer 400 is further included. The semiconductor device 10b of FIG. 2A includes substantially the same elements as those in the semiconductor device 10a of FIG. 1A, and thus, detailed descriptions of the substantially the same elements will be omitted to avoid redundancy.

Referring to FIG. 2A, the conductive layer 400 may be disposed between the first TFT 200 and the second TFT 300. The conductive layer 400 may at least partially overlap with the first gate electrode 202 of the first TFT 200 and the second gate electrode 302 of the second TFT 300.

The conductive layer 400 may be an exemplary electrode below the second TFT 300. In this case, the conductive layer 400 may have a greater size or area than the second gate electrode 302. At least one edge of the conductive layer 400 may extend beyond an edge of the second gate electrode 302 by a certain length L. For example, an edge of the conductive layer 400 may extend beyond an edge of the second gate electrode 302 by 1.5 μm or more.

FIG. 2B is a plan view illustrating a relationship between the conductive layer 400 and the second gate electrode 302 of the second TFT 300 in terms of location and size.

Referring to FIGS. 2A and 2B, an edge of the conductive layer 400 may extend beyond an edge of the second gate electrode 302 by a certain length L. Although FIGS. 2A and 2B show that the conductive layer 400 extends beyond the second gate electrode 302 in two opposing directions, however, the inventive concepts are not limited thereto. For example, at least one edge of the conductive layer 400 may extend from an edge of the second gate electrode 302. The extending lengths L of the two end edges of the conductive layer 400 may be different from each other.

Table 1 shows a result of an experiment of a variation in a threshold voltage Vth_sat of the second TFT 300 according to a change in a voltage VGAT1 of the first gate electrode 202, when no conductive layers 400 are included.

TABLE 1

| VGAT1 | −5 | 0 | 5 | 10 |
|---|---|---|---|---|
| Vth_sat | −1.874 | −2.353 | −2.753 | −3.143 |
| VGAT1 | 15 | 20 | 25 | 30 |
| Vth_sat | −3.539 | −3.942 | −4.359 | −4.775 |

As shown in Table 1, as a change in a voltage VGAT1 of the first gate electrode 202 increases, the variation in the threshold voltage Vth_sat of the second TFT 300 is increased.

It can be confirmed by the experiment of Table 1 that, even when the voltage of the second gate electrode 302 changes, a change in current characteristics of the first TFT 200 was small. This is because the change in the voltage of the second gate electrode 302 does not affect a channel of the first TFT 200, due to a shielding effect of the first gate electrode 202.

In the semiconductor device 10b of FIG. 2A, the conductive layer 400 is disposed between the first TFT 200 and the second TFT 300, which may prevent coupling between the first TFT 200 and the second TFT 300, thereby more stably driving the second TFT 300.

The conductive layer 400 may receive a constant DC voltage. The DC voltage may be one of DC powers applied to the semiconductor device 10b, or may be a voltage added separately from the DC powers. According to an exemplary embodiment, the conductive layer 400 may be an electrode of a capacitor having the first gate electrode 202 of the first TFT 200 as another electrode.

Figure 3A:
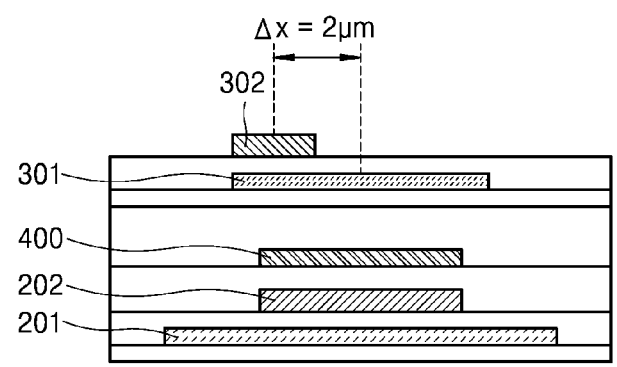
FIG. 3A, FIG. 3B, and FIG. 3C are views illustrating relationships between a conductive layer of FIG. 2A and a second gate electrode of FIG. 2A in terms of location and voltage.
Figure 3A:
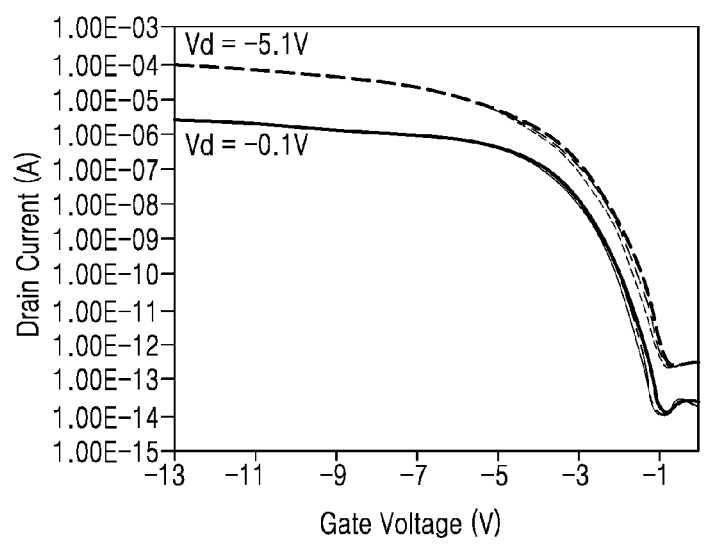
Figure 3B:
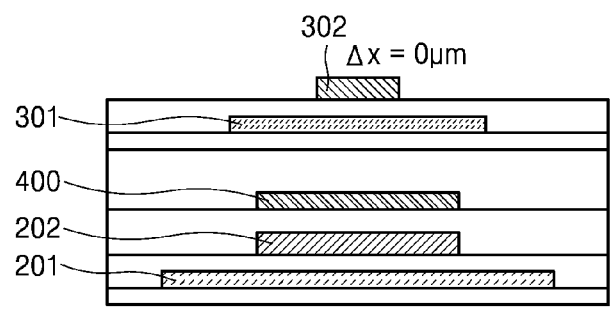
Figure 3B:
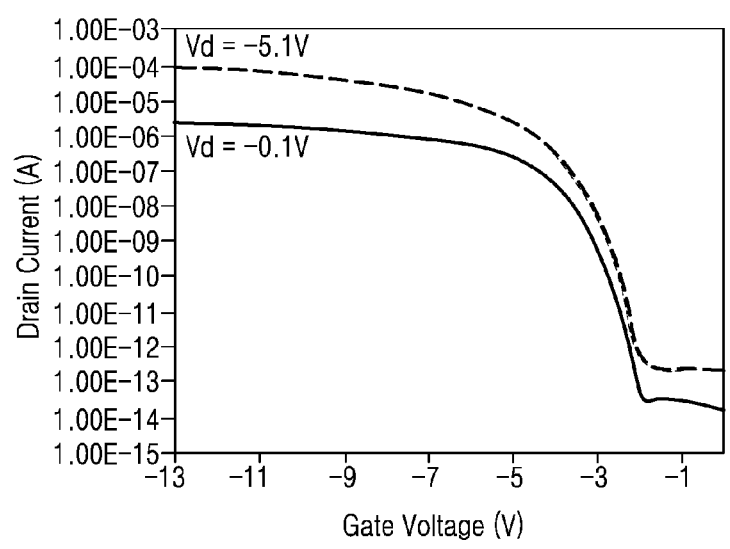
Figure 3C:
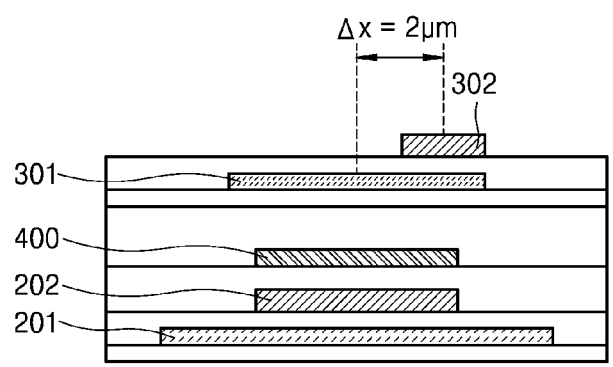
Figure 3C:
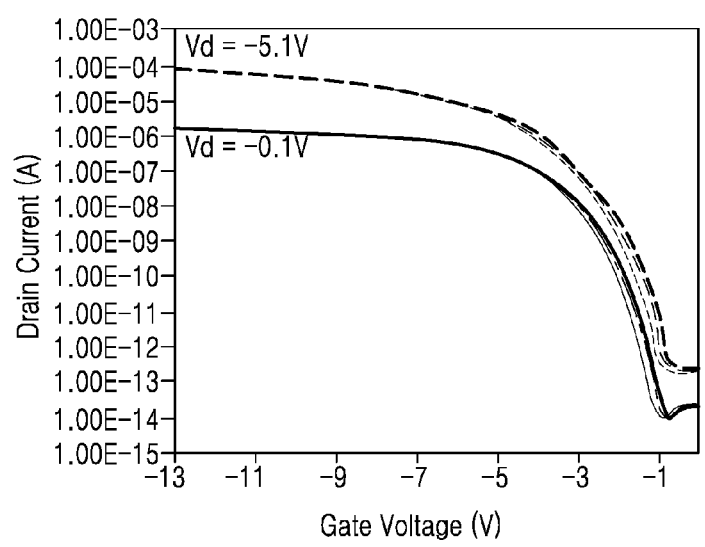

FIGS. 3A through 3C are views illustrating relationships between the conductive layer 400 of FIG. 2A and the second gate electrode 302 of FIG. 2A in terms of location and voltage. For convenience of description, FIGS. 3A to 3C illustrate only the first active layer 201, the first gate electrode 202, the conductive layer 400, the second active layer 301, and the second gate electrode 302.

FIGS. 3A through 3C correspond to examples in which a gate voltage sweeping between 5V and −30V is applied to the first gate electrode 202, and a voltage of 9V is applied to the conductive layer 400. FIGS. 3A through 3C also illustrate graphs showing a relationship between a drain current and a gate voltage of the second TFT 300, when a drain voltage Vd of the second TFT 300 is −0.1V and −5.1V. FIGS. 3A through 3C correspond to a case where a center of the conductive layer 400 is aligned with that of the second active layer 301.

Referring to FIG. 3A, when a position of the second gate electrode 302 (center of the second gate electrode 302) deviates from that of the conductive layer 400 (center of the conductive layer 400) by about 2 μm to the left, a variation ΔVth of a threshold voltage Vth in a saturation region of the second TFT 300 is about 0.18V.

Referring to FIG. 3B, when the position of the second gate electrode 302 (center of the second gate electrode 302) aligns with that of the conductive layer 400 (center of the conductive layer 400), the variation ΔVth of the threshold voltage Vth in the saturation region of the second TFT 300 is about 0.1V.

Referring to FIG. 3C, when the location of the second gate electrode 302 (center of the second gate electrode 302) deviates from the conductive layer 400 (center of the conductive layer 400) about 2 μm to the right, the variation ΔVth of the threshold voltage Vth in the saturation region of the second TFT 300 is about 0.25V.

Table 2 shows variations ΔVth of the threshold voltage Vth in the saturation region of the second TFT 300 when voltages of the conductive layer 400 are −2V, 0V, and 9V, in the examples of FIGS. 3A through 3C.

TABLE 2

|  | 2 μm (to the left side) | 0 μm | 2 μm (to the right side) |
|---|---|---|---|
| −2 V | 0.2 V | 0.08 V | 0.26 V |
| 0 V | 0.2 V | 0.1 V | 0.27 V |
| 9 V | 0.18 V | 0.1 V | 0.25 V |

Referring to Table 2, an influence from a shift in location of the second gate electrode 302 relative to the conductive layer 400 to the threshold voltage Vth of the second TFT 300 is greater than an influence of a voltage of the conductive layer 400 to the threshold voltage Vth of the second TFT 300.

According to an exemplary embodiment, a range of misalignment between the conductive layer 400 and the second gate electrode 302 may be set, such that the variation ΔVth of the threshold voltage Vth of the second TFT 300 becomes less than 0.44V which is obtained based on a threshold voltage distribution of the second TFT 300. As used herein, the misalignment may be a distance between the center of the conductive layer 400 and the center of the second gate electrode 302. The range of the misalignment between the conductive layer 400 and the second gate electrode 302 may be about 0 to about 3 μm.

FIGS. 4A through 8 are cross-sectional views schematically illustrating a method of manufacturing a semiconductor device according to an exemplary embodiment.

Figure 4A:
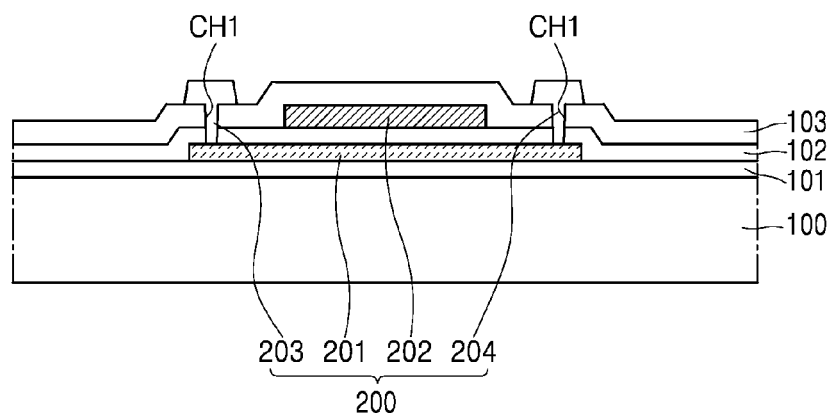
FIG. 4A, FIG. 4B, FIG. 5, FIG. 6, FIG. 7, and FIG. 8 are cross-sectional views schematically illustrating a method of manufacturing a semiconductor device according to an exemplary embodiment.

Referring to FIG. 4A, the first TFT 200 may be formed on the substrate 100. The first buffer layer 101 may be disposed on the substrate 100.

The substrate 100 may be formed of any of various materials, such as glass, plastic, or metal. According to an exemplary embodiment, the substrate 100 may be a flexible substrate. As used herein, the flexible substrate may refer a substrate that may be easily bent, folded, or rolled. The flexible substrate may be formed of ultra-thin glass, metal, or plastic.

The first buffer layer 101 may block impurities from permeating through the substrate 100 and planarize the surface of the substrate 100. The first buffer layer 101 may include an inorganic material, such as silicon nitride ($SiN_x$) and/or silicon oxide ($SiO_x$), and may have a single-layered or a multi-layered structure. According to an exemplary embodiment, the first buffer layer 101 may be omitted.

A semiconductor layer may be formed on the first buffer layer 101, and then patterned to be formed as the first active layer 201 of the first TFT 200. The semiconductor layer may include various materials. For example, the semiconductor layer may include an inorganic semiconductor material, such as amorphous silicon or crystalline silicon. As another example, the semiconductor layer may include an oxide semiconductor or an organic semiconductor material.

A first insulating layer 102 may be formed on the substrate 100 to cover the first active layer 201. The first insulating layer 102 may be an inorganic insulation layer. The first insulating layer 102 may be formed of at least one insulating material including $SiO_x$, $SiN_x$, silicon oxynitride (SiON), $Al_2O_3$, $TiO_2$, $Ta_2O_5$, $HfO_2$, $ZrO_2$, BST, and PZT, and have a single-layered or a multi-layered structure.

The first gate electrode 202 may be formed on the first insulating layer 102. The first gate electrode 202 may be formed of various conductive materials. For example, the first gate electrode 202 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. The first gate electrode 202 may overlap at least a portion of the first active layer 201.

According to an exemplary embodiment, by using the first gate electrode 202 as a mask, the first active layer 201 may be doped with B or P ion impurities. Accordingly, the first active layer 201 may include a source region doped with impurities, a drain region doped with impurities, and a channel region between the source and drain regions.

A second insulating layer 103 may be formed on the first gate electrode 202. The second insulating layer 103 may be an inorganic insulation layer. The second insulating layer 103 may include at least one insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure. According to another exemplary embodiment, the second insulating layer 103 may be an organic insulating layer.

The first insulating layer 102 and the second insulating layer 103 may be patterned to form contact holes CH1 therein, respectively, exposing portions of the source region and the drain region of the first active layer 201.

The first source electrode 203 and the first drain electrode 204 may be formed on the second insulating layer 103. The first source electrode 203 and the first drain electrode 204 may be formed of various conductive materials. For example, each of the first source electrode 203 and the first drain electrode 204 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. The first source electrode 203 and the first drain electrode 204 may include the same or different materials forming the first gate electrode 202. The first source electrode 203 and the first drain electrode 204 may respectively contact the source region and the drain region of the first active layer 201 via the contact holes CH1.

Figure 4B:
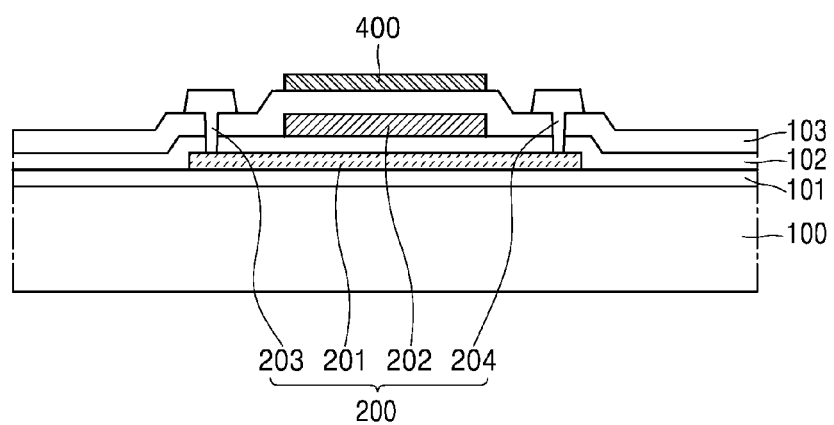

Referring to FIG. 4B, the conductive layer 400 may be further formed on the second insulating layer 103. The conductive layer 400 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. The conductive layer 400 may include the same or different materials forming the first gate electrode 202, the first source electrode 203, and the first drain electrode 204. In particular, the conductive layer 400 may be formed simultaneously with the first source electrode 203 and the first drain electrode 204, or may be formed in a separate process from a process of forming the first source electrode 203 and the first drain electrode 204.

Figure 5:
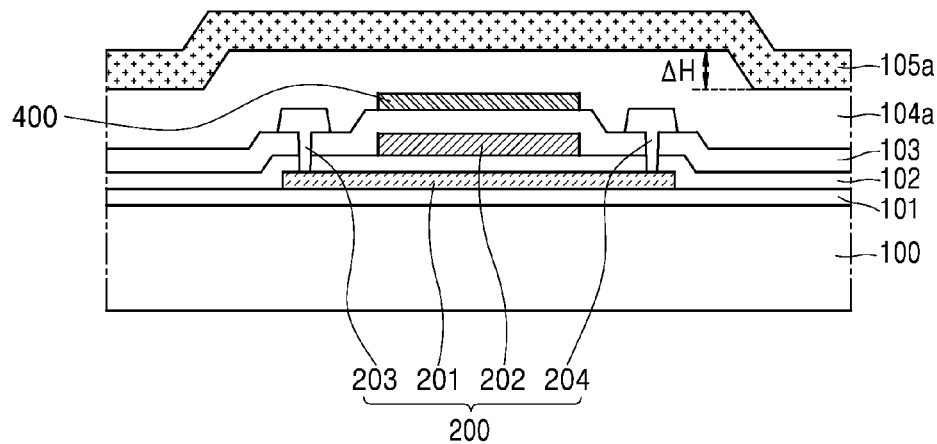

Referring to FIG. 5, a third insulating layer 104a and a fourth insulating layer 105a may be sequentially formed on the substrate 100 to cover the conductive layer 400. Due to a structure of the first TFT 200 below the third insulating layer 104a, the third insulating layer 104a may have a step ΔH formed by a convex portion and a concave portion thereof.

The third insulating layer 104a may include at least one insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure.

The fourth insulating layer 105a may include at least one insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure.

A material used to form the fourth insulating layer 105a may be different from that of the third insulating layer 104a. The material used to form the fourth insulating layer 105a may be different from that used to form an upper portion of the third insulating layer 104a. For example, the third insulating layer 104a may be an insulating layer including $SiO_x$, or a multi-layer of a lower insulating layer including SiO$_x$ and an upper insulating layer including SiN$_x$. The fourth insulating layer 105a may be an insulating layer including SiO$_x$.

Figure 6:
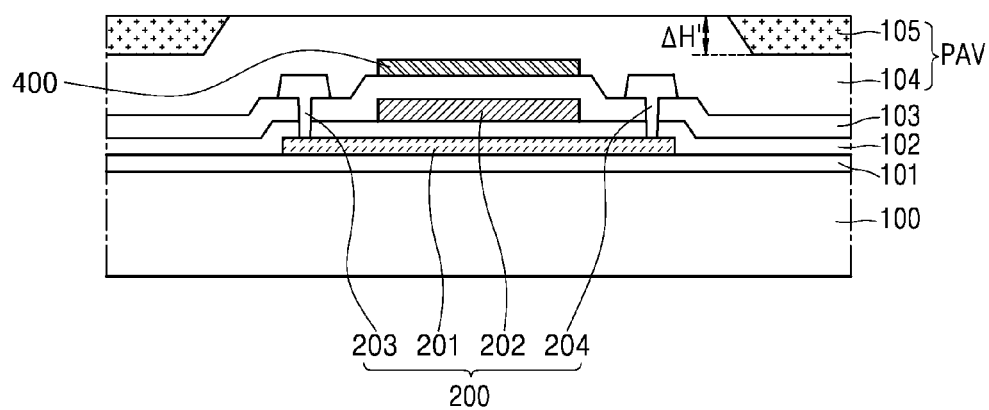

Referring to FIG. 6, a portion of the fourth insulating layer 105a may be removed to expose an upper surface of the third insulating layer 104a, thereby forming the planarization layer PAV including the third insulating layer 104 and the fourth insulating layer 105. When the fourth insulating layer 105a is removed, a portion of the third insulating layer 104a may also be removed.

The fourth insulating layer 105a may be removed by any of various etching processes. For example, an etching process may include dry etching or a polishing process, such as chemical mechanical polishing (CMP). The CMP is a technique of planarizing the surface of a to-be-processed product by using chemical and mechanical actions. In the CMP, when a to-be-processed product is in contact with a surface of a polishing pad, slurry is supplied to cause chemical reaction with the surface of the to-be-processed product, during which a platen and the polishing head move relative to each other to mechanically planarize the surface of the to-be-processed product.

The third insulating layer 104a has a convex portion and the concave portion due to the first TFT 200 and the conductive layer 400 formed below the third insulating layer 104a. The etching process described above may cause the concave portion of the third insulating layer 104a to be filled with the fourth insulating layer 105a.

The upper surface of the third insulating layer 104 and the upper surface of the fourth insulating layer 105 may be substantially flush with each other, thereby generally forming a flat upper surface. Accordingly, an influence from a lower wiring pattern to upper layers to be formed later may be reduced, thereby improving coverage of the upper layers. After the etching process, a step ΔH' of the third insulating layer 104 may be less than or equal to the step ΔH of the third insulating layer 104a shown in FIG. 5.

Figure 7:
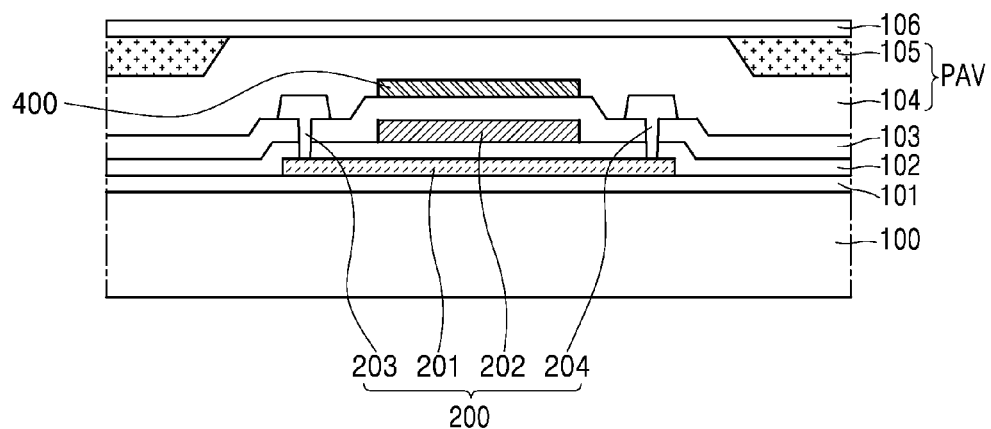

Referring to FIG. 7, the second buffer layer 106 may be formed on the flat upper surface of the third and fourth insulating layers 104 and 105. The second buffer layer 106 may include at least one insulating material of SiO$_x$, SiN$_x$, SiON, Al$_2$O$_3$, TiO$_2$, Ta$_2$O$_5$, HfO$_2$, ZrO$_2$, BST, and PZT, and have a single-layered or a multi-layered structure. For example, the second buffer layer 106 may be an insulating layer including SiO$_x$, more specifically, SiO$_2$. Alternatively, the second buffer layer 106 may be a multi-layered insulating layer including a lower insulating layer including SiO$_2$ and an upper insulating layer including SiON.

Next, the second buffer layer 106 and the planarization layer PAV may undergo thermal treatment. The thermal treatment may include dehydrogenation treatment. The second buffer layer 106 may perform a barrier function of preventing hydrogen H$_2$ generated from lower insulating layers from spreading to an upper layer.

Figure 8:
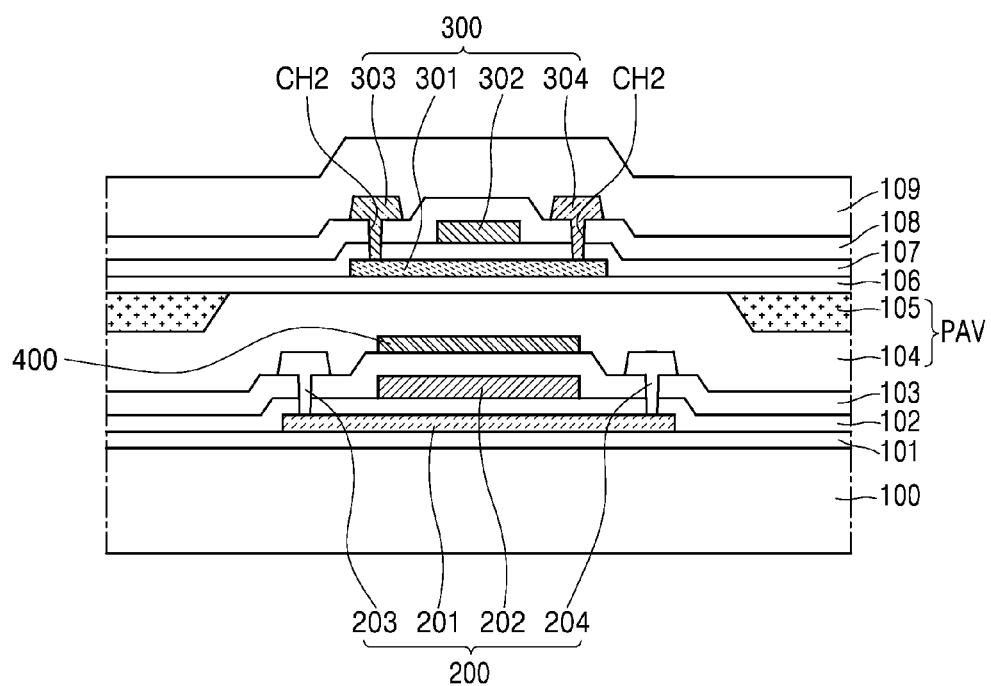

Referring to FIG. 8, the second TFT 300 may be formed on the second buffer layer 106. More particularly, a semiconductor layer may be formed on the second buffer layer 106, and then patterned to be formed as the second active layer 301 of the second TFT 300. The semiconductor layer may include various materials. For example, the semiconductor layer may include an inorganic semiconductor material, such as amorphous silicon or crystalline silicon. As another example, the semiconductor layer may include an oxide semiconductor or an organic semiconductor material. The semiconductor layer may be crystallized via excimer laser annealing (ELA).

The thickness of the second active layer 301 may be about 80% or less than that of the first active layer 201. During crystallization of the semiconductor layer via ELA, high laser energy may cause damage to the lower layers. Accordingly, in an exemplary embodiment, the second active layer 301 is formed to have a small thickness, such that ELA crystallization is performed with a laser energy band that does not affect the lower layer. A lower limit of the thickness of the second active layer 301 may be determined in consideration of the characteristics of a device, such as the first TFT 200 and/or the second TFT 300.

A fifth insulating layer 107 may be formed on the second buffer layer 106 to cover the second active layer 301. The fifth insulating layer 107 may be an inorganic insulation layer. The fifth insulating layer 107 may include at least one insulating material of SiO$_x$, SiN$_x$, SiON, Al$_2$O$_3$, TiO$_2$, Ta$_2$O$_5$, HfO$_2$, ZrO$_2$, BST, and PZT, and have a single-layered or a multi-layered structure.

The second gate electrode 302 may be formed on the fifth insulating layer 107. The second gate electrode 302 may be formed of various conductive materials. For example, the second gate electrode 302 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. The second gate electrode 302 may overlap at least a portion of the second active layer 301.

According to an exemplary embodiment, by using the second gate electrode 302 as a mask, the second active layer 301 may be doped with B or P ion impurities. Accordingly, the second active layer 301 may include a source region doped with impurities, a drain region doped with impurities, and a channel region between the source and drain regions.

A sixth insulating layer 108 may be formed on the second gate electrode 302. The sixth insulating layer 108 may be an inorganic insulating layer. The sixth insulating layer 108 may include at least one insulating material of SiO$_x$, SiN$_x$, SiON, Al$_2$O$_3$, TiO$_2$, Ta$_2$O$_5$, HfO$_2$, ZrO$_2$, BST, and PZT, and have a single-layered or a multi-layered structure. According to another exemplary embodiment, the sixth insulating layer 108 may be an organic insulating layer.

The fifth insulating layer 107 and the sixth insulating layer 108 may be patterned to include contact holes CH2 therein, respectively, which expose portions of the source region and the drain region of the second active layer 301.

The second source electrode 303 and the second drain electrode 304 may be formed on the sixth insulating layer 108. The second source electrode 303 and the second drain electrode 304 may be formed of various conductive materials. For example, each of the second source electrode 303 and the second drain electrode 304 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. The second source electrode 303 and the second drain electrode 304 may include the same or different materials forming the second gate electrode 302. The second source electrode 303 and the second drain electrode 304 may contact the source region and the drain region of the second active layer 301 via the contact holes CH2, respectively.

Next, a seventh insulating layer 109 (see also FIGS. 1A and 2A) may be formed on the substrate 100 to cover the second source electrode 303 and the second drain electrode 304. The seventh insulating layer 109 may include at least one inorganic insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure. According to another exemplary embodiment, the seventh insulating layer 109 may include at least one organic insulating material of a commercial polymer, such as polymethyl methacrylate (PMMA) or polystyrene (PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like, and have a single-layered or a multi-layered structure.

Figure 9:
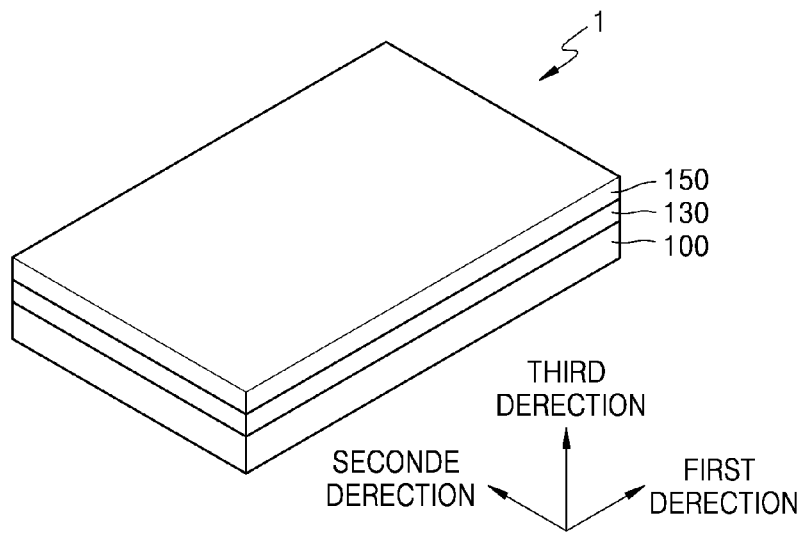
FIG. 9 is a perspective view of a display apparatus according to an exemplary embodiment.
Figure 10:
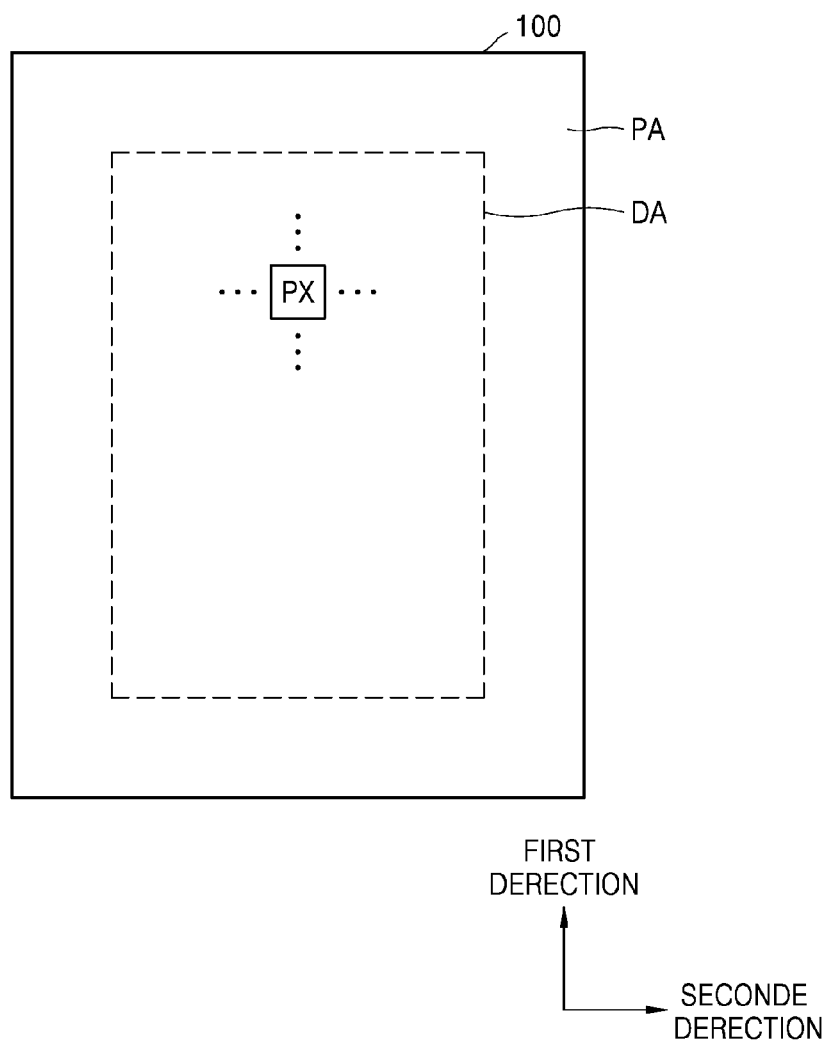
FIG. 10 is a schematic plan view of the display apparatus of FIG. 9.

FIG. 9 is a perspective view of a display apparatus 1 according to an exemplary embodiment. FIG. 10 is a schematic plan view of the display apparatus 1.

Referring to FIGS. 9 and 10, the display apparatus 1 includes a substrate 100, a display unit 130 disposed on the substrate 100, and an encapsulation member 150 covering the display unit 130. The substrate 100, the display unit 130, and the encapsulation member 150 are sequentially stacked on one another in a third direction.

The display apparatus 1 may be a liquid crystal display (LCD), an organic light-emitting display, an electrophoretic display, an electrowetting display panel, or the like. Hereinafter, the display apparatus 1 will be described as an organic light-emitting display.

The substrate 100 includes a display area DA and a peripheral area PA around the display area DA. The display unit 130 may be formed in the display area DA. The display unit 130 may include a plurality of pixels PX arranged in a first direction and a second direction. Each pixel PX may include a display element, and a pixel circuit electrically connected to the display element. The pixel circuit may include at least one TFT and at least one capacitor.

The encapsulation member 150 may include a substrate or at least one thin film stacked on the display unit 130. According to an exemplary embodiment, the encapsulation member 150 may include a plurality of thin films, which may prevent external moisture and/or air from permeating into the display unit 130.

Figure 11:
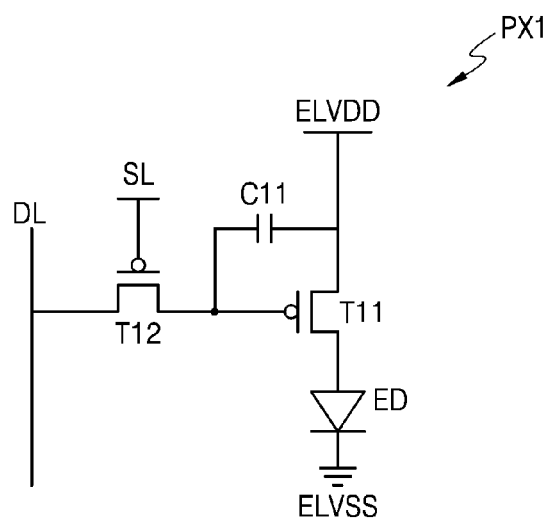
FIG. 11 is a circuit diagram of a first pixel according to an exemplary embodiment.

FIG. 11 is a circuit diagram of a first pixel PX1 of the display apparatus 1 according to an exemplary embodiment.

Referring to FIG. 11, the first pixel PX1 may include a pixel circuit and a display element ED connected to the pixel circuit. The pixel circuit may include a first transistor T11, a second transistor T12, and a capacitor C11.

The first transistor T11 includes a gate electrode connected to a second electrode of the second transistor T12, a first electrode that receives a first power supply voltage ELVDD, and a second electrode connected to the display element ED.

The second transistor T12 includes a gate electrode connected to a scan line SL, a first electrode connected to a data line DL, and a second electrode connected to the gate electrode of the first transistor T11.

The capacitor C11 includes a first electrode connected to the gate electrode of the first transistor T11 and the second electrode of the second transistor T12, and a second electrode that receives the first power supply voltage ELVDD.

The display element ED may be connected to the pixel circuit via the first transistor T11. The display element ED may be an organic light-emitting diode (OLED). The OLED includes a first electrode connected to the second electrode of the first transistor T11, a second electrode that receives a second power supply voltage ELVSS, and an emission layer disposed between the first electrode and the second electrode. The first power supply voltage ELVDD may be higher than the second power supply voltage ELVSS.

Although FIG. 11 shows a pixel having a P-type transistor, however, the inventive concepts are not limited thereto, and a pixel may have an N-type transistor.

Figure 12:
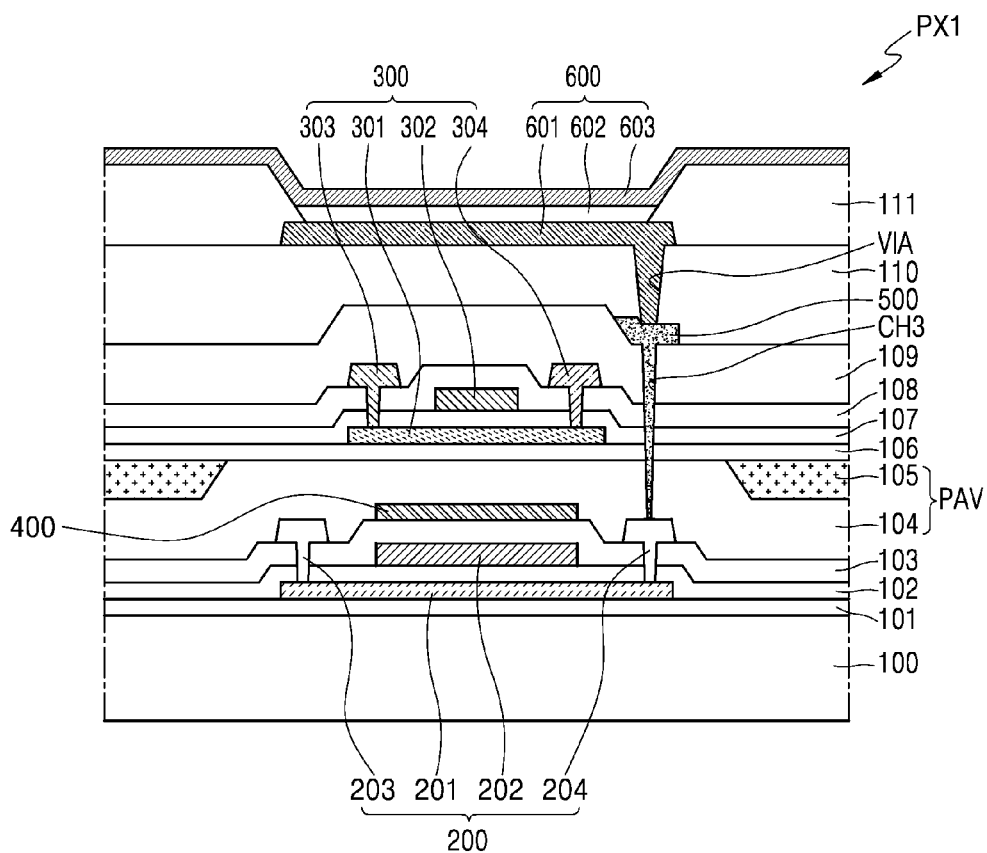
FIG. 12 is a partial cross-sectional view of the first pixel of FIG. 11.

FIG. 12 is a cross-sectional view of a portion of the first pixel PX1 of FIG. 11. In the illustrated exemplary embodiment, a first electrode and a second electrode of a transistor are interchangeably used as a source electrode and a drain electrode of a TFT.

Referring to FIGS. 11 and 12, the first pixel PX1 may include the first TFT 200 and the second TFT 300 of the semiconductor device 10b described above, respectively. A process of manufacturing the first TFT 200 and the second TFT 300 is the same as the above-described process of manufacturing a semiconductor device. Although not particularly shown, the first pixel PX1 of FIG. 12 according to an exemplary embodiment may include the first TFT 200 and the second TFT 300 of the semiconductor device 10a shown in FIG. 1A.

The first transistor T11 may be implemented using the first TFT 200. The first TFT 200 may include the first active layer 201, the first gate electrode 202, the first source electrode 203, and the first drain electrode 204. The first source electrode 203 and the first drain electrode 204 may be electrically connected to the source region and the drain region of the first active layer 201, respectively, via the contact holes CH1.

The second transistor T12 may be implemented using the second TFT 300. The second TFT 300 may include the second active layer 301, the second gate electrode 302, the second source electrode 303, and the second drain electrode 304.

The capacitor C11 may be implemented by using the first gate electrode 202 and the conductive layer 400 as the first and second electrodes, respectively. The first power supply voltage ELVDD, which may have a constant voltage, may be applied to the conductive layer 400.

The second active layer 301 and the second gate electrode 302 of the second TFT 300 may be disposed to at least partially overlap the conductive layer 400. The conductive layer 400 may be formed to be larger in size than the second gate electrode 302, so as to prevent affecting a back channel of the second TFT 300. The edge of the conductive layer 400 may extend beyond the edge of the second gate electrode 302 by about 1.5 μm or more. Accordingly, the conductive layer 400 may function as a shielding layer, and thus, may minimize an influence of a potential of a lower line and/or electrode, such as the first gate electrode 202, to the second TFT 300.

The planarization layer PAV including the third insulating layer 104 and the fourth insulating layer 105 may be disposed between the first TFT 200 and the second TFT 300. The second buffer layer 106 may be disposed on the planarization layer PAV. The seventh insulating layer 109 may be disposed on the sixth insulating layer 108 to cover the second TFT 300.

The third through seventh insulating layers 104 through 109 may include a contact hole CH3, by which a portion of one of the first source electrode 203 and the first drain electrode 204 of the first TFT 200 is exposed. FIG. 12 exemplarily shows that the first drain electrode 204 is exposed by the contact hole CH3.

A connecting electrode 500 may be disposed on the seventh insulating layer 109 to fill the contact hole CH3. The connecting electrode 500 may contact the first drain electrode 204. The connecting electrode 500 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure.

An eighth insulating layer 110 may be disposed on the seventh insulating layer 109 to cover the connecting electrode 500. The eighth insulating layer 110 may have single layered or a multi-layered structure formed of an organic insulating material. The eighth insulating layer 110 may include a commercial polymer, such as PMMA or PS, a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. For example, the eighth insulating layer 110 may include polyimide, polyamide (PA), acryl resin, or the like.

The eighth insulating layer 110 may function as a planarization layer having a flat upper surface. The eighth insulating layer 110 may include a via hole VIA that exposes a portion of the connecting electrode 500.

A display element 600 (display element ED in FIG. 11) may be disposed on the eighth insulating layer 110. The display element 600 may include a first electrode 601, a second electrode 603 opposite to the first electrode 601, and an intermediate layer 602 disposed between the first electrode 601 and the second electrode 603.

The first electrode 601 may fill the via hole VIA and contact the connecting electrode 500. Accordingly, the first electrodes 601 may be electrically connected to the first TFT 200.

A ninth insulating layer 111 may be disposed on the eighth insulating layer 110 to cover an edge of the first electrode 601. The ninth insulating layer 111 may include at least one inorganic insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure. According to another exemplary embodiment, the ninth insulating layer 111 may include at least one organic insulating material of a commercial polymer (such as PMMA or PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like, and have a single-layered or a multi-layered structure.

The first electrode 601 may include a reflective layer including a reflective conductive material, such as silver (Ag), magnesium (Mg), aluminum (Al), platinum (Pt), palladium (Pd), gold (Au), nickel (Ni), neodymium (Nd), iridium (Ir), chromium (Cr), or a compound thereof. According to an exemplary embodiment, the first electrode 601 may include at least one transparent conductive oxide of indium tin oxide (ITO), indium zinc oxide (IZO), zinc oxide (ZnO), indium oxide ($In_2O_3$), indium gallium oxide (IGO), and aluminum zinc oxide (AZO). According to an exemplary embodiment, the first electrode 601 may be a stack of the reflective layer and the transparent conductive layer.

The intermediate layer 602 including an emission layer may be formed on the first electrode 601. The emissive layer may include a low-molecular weight organic material or a high-molecular weight organic material. The display element 600 may emit red light, green light, or blue light, depending on the type of emission layer. However, the inventive concepts are not limited thereto, and a plurality of organic emission layers may be disposed on a single display element 600. For example, a plurality of organic emission layers respectively emitting light of red, green, and blue colors may be stacked or mixed vertically to emit white color light. In this case, the display apparatus 1 may further include a color converting layer or a color filter that coverts the white light into a light of a predetermined color. The red, green, and blue colors are exemplary, and thus a color combination for emitting white light is not limited thereto.

The intermediate layer 602 may include at least one functional layer of a hole injection layer (HIL), a hole transport layer (HTL), an electron transport layer (ETL), and an electron injection layer (EIL) between the first electrode 601 and the emission layer and/or between the emission layer and the second electrode 603. According to an exemplary embodiment, the intermediate layer 602 may further include various other functional layers.

Although FIG. 12 shows that the intermediate layer 602 is patterned to correspond to only the first electrode 601, the inventive concepts are not limited thereto, and the intermediate layer 602 may be integrally formed with an intermediate layer 602 of a pixel adjacent to the first pixel PX1. Alternatively, at least one layer of the intermediate layer 602 may be formed for each pixel, and the other layers thereof may be integrally formed with the intermediate layer 602 of the adjacent pixel.

The second electrode 603 may be formed on the intermediate layer 602 over the entire area of the display region DA of the substrate 100. The second electrode 603 may include various conductive materials. For example, the second electrode 603 may include a semi-transparent reflection layer including at least one of lithium (Li), calcium (Ca), lithium fluoride (LiF), aluminum (Al), magnesium (Mg), and silver (Ag), or may include a light-transmitting metal oxide, such as ITO, IZO, or ZnO, and may have a single layered or a multi-layered structure.

In FIG. 12, the display element 600 is disposed to overlap the first TFT 200 and the second TFT 300 below the display element 600. However, according to another exemplary embodiment, the display element 600 may be disposed to not overlap or at least partially overlap the first TFT 200 and the second TFT 300.

Figure 13:
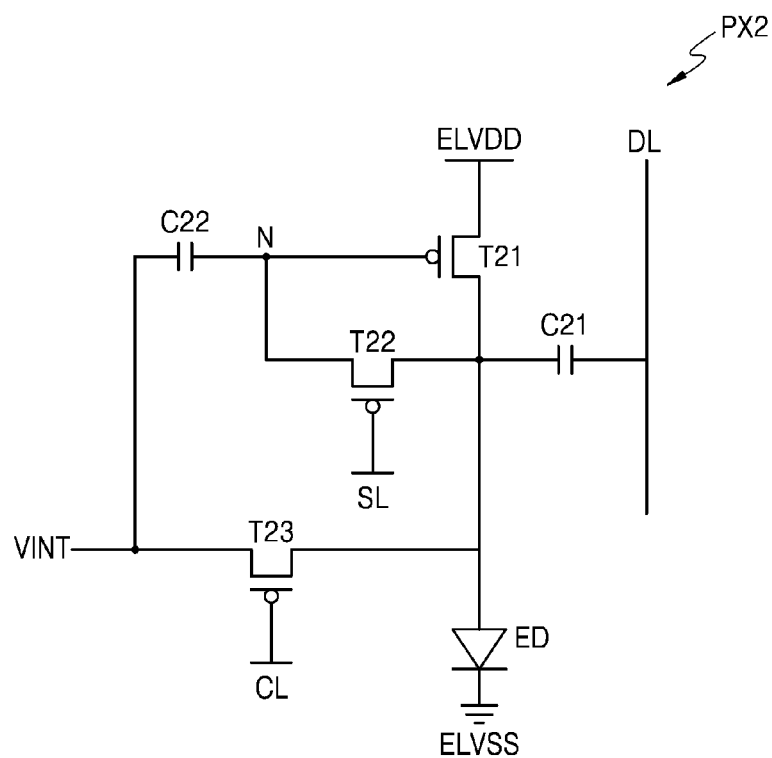
FIG. 13 is a circuit diagram of a second pixel according to another exemplary embodiment.

FIG. 13 is a circuit diagram of a second pixel PX2 of the display apparatus 1 according to another exemplary embodiment.

Referring to FIG. 13, the second pixel PX2 may include a pixel circuit and a display element ED connected to the pixel circuit. The pixel circuit may include a first transistor T21, a second transistor T22, a third transistor T23, a first capacitor C21, and a second capacitor C22.

The first transistor T21 includes a gate electrode connected to a first electrode of the second transistor T22, a first electrode that receives a first power supply voltage ELVDD, and a second electrode connected to the display element ED.

The second transistor T22 includes a gate electrode connected to the scan line SL, a first electrode connected to the gate electrode of the first transistor T21, and a second electrode connected to the second electrode of the first transistor T21.

The third transistor T23 includes a gate electrode connected to the control line CL, a first electrode that receives an initializing voltage VINT, and a second electrode connected to the second electrode of the first transistor T21 and the second electrode of the second transistor T22.

The first capacitor C21 includes a first electrode connected to the data line DL, and a second electrode connected to the second electrode of the first transistor T21. The first capacitor C21 may store a data voltage applied to the data line DL.

The second capacitor C22 includes a first electrode that receives the initializing voltage VINT, and a second electrode connected to the gate electrode of the first transistor T21.

The display element ED may be connected to the pixel circuit via the first transistor T21. The display element ED may be an OLED. The OLED includes a first electrode connected to the second electrode of the first transistor T21, a second electrode that receives a second power supply voltage ELVSS, and an emission layer disposed between the first electrode and the second electrode. The first power supply voltage ELVDD may be higher than the second power supply voltage ELVSS.

The second pixel PX2 may be operated according to a first period of initializing the first electrode of the display element ED, a second period of compensating for a threshold voltage of the first transistor T21, a third period of writing a data voltage, and a fourth period during which the display element ED emits light.

In the first period, the second transistor T22 and the third transistor T23 are turned on, and thus, the first electrode of the display element ED may be initialized to the initializing voltage VINT.

In the second period, the second transistor T22 is turned on, and accordingly, the first transistor T21 is diode-connected, and thus, a threshold voltage of the first transistor T21 may be compensated for.

In the third period, the second transistor T22 is turned on and the first transistor T21 and the third transistor T23 are turned off, and thus, the first capacitor C21 and the second capacitor C22 may be serially connected to each other at a node N. The data voltage may be applied to the data line DL. Accordingly, the data voltage is distributed to the first capacitor C21 and the second capacitor C22, and a distributed voltage may be applied to the node N.

In the fourth period, as the initializing voltage VINT is applied to the node N, the first transistor T21 is turned on. As a driving current corresponding to a voltage applied to the gate electrode (node N) of the first transistor T21 flows into the display element ED, the display element ED may emit light.

Figure 14:
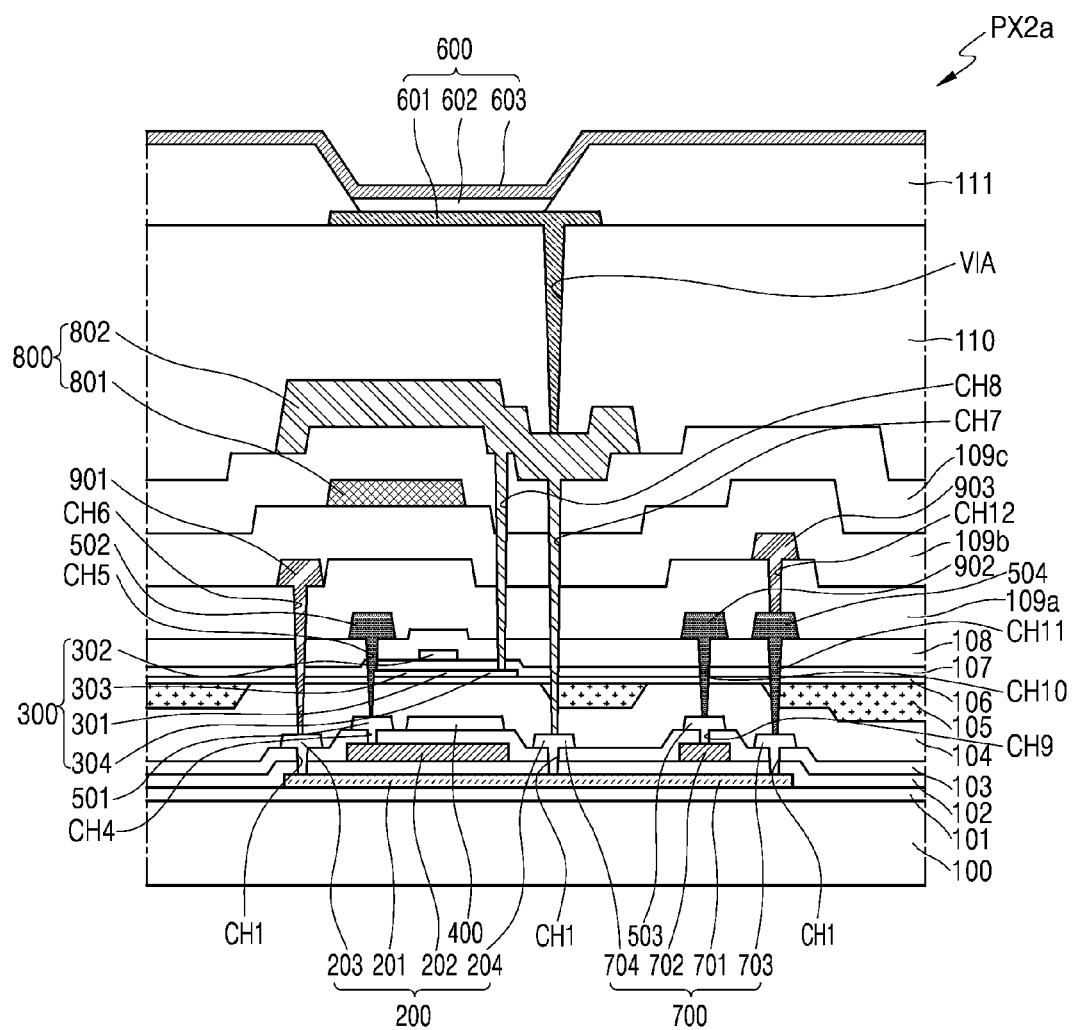
FIG. 14 and FIG. 15 are partial cross-sectional views of the second pixel of FIG. 13 according to exemplary embodiments.
Figure 15:
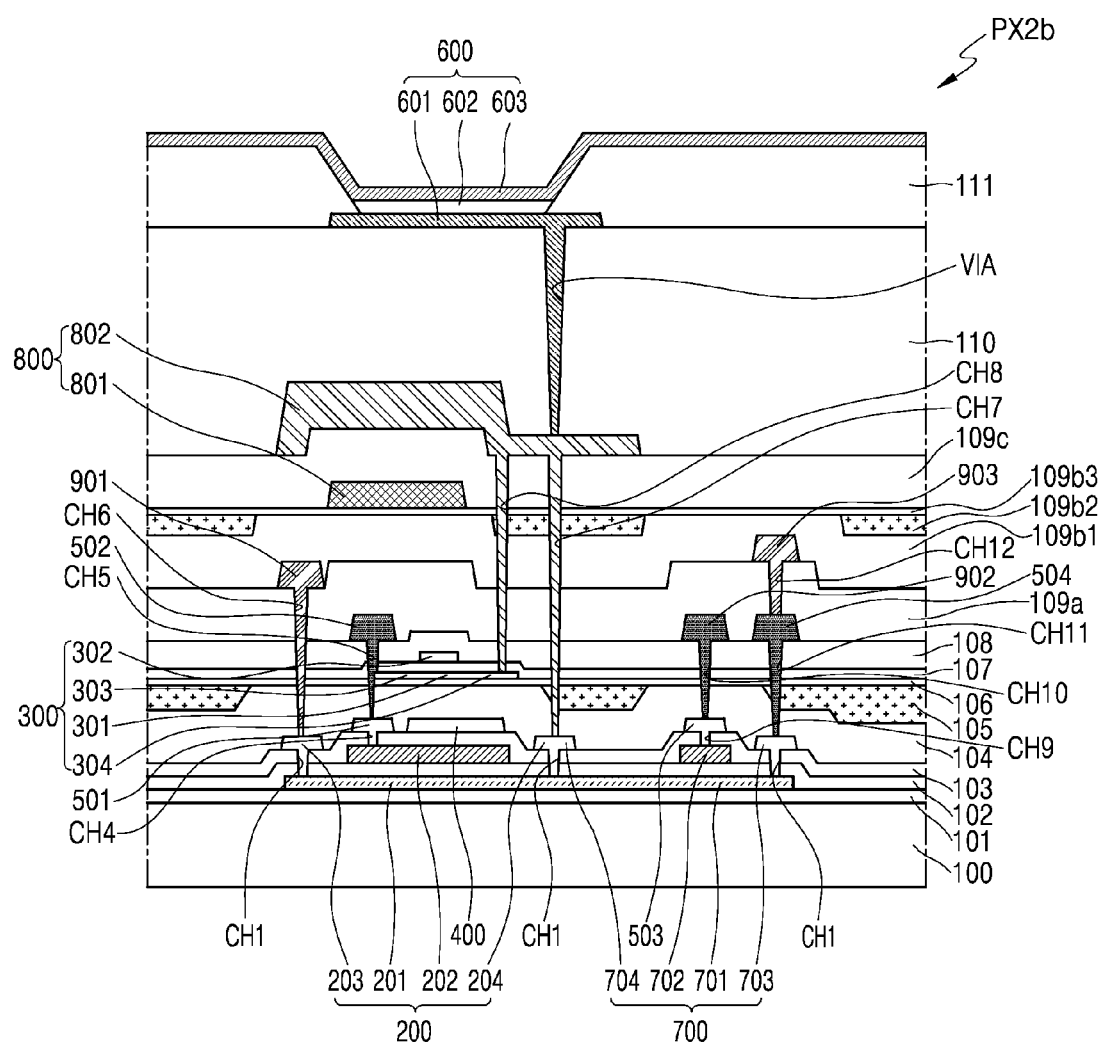

FIGS. 14 and 15 are cross-sectional views of portions of the second pixel PX2 of FIG. 13 according to exemplary embodiments.

In the exemplary embodiments of FIGS. 14 and 15, a first electrode and a second electrode of a transistor are interchangeably used as a source electrode and a drain electrode of a TFT.

Referring to FIGS. 13 and 14, a second pixel PX2a may include the first TFT 200 and the second TFT 300 of the above-described semiconductor device 10b. Although not particularly shown, the second pixel PX2a of FIG. 14 according to an exemplary embodiment may include the first TFT 200 and the second TFT 300 of the semiconductor device 10a shown in FIG. 1A.

The first transistor T21 may be implemented using the first TFT 200. The first TFT 200 may include the first active layer 201, the first gate electrode 202, the first source electrode 203, and the first drain electrode 204. The first source electrode 203 and the first drain electrode 204 may be electrically connected to the source region and the drain region of the first active layer 201, respectively, via the contact holes CH1.

The second transistor T22 may be implemented using the second TFT 300. The second TFT 300 may include the second active layer 301, the second gate electrode 302, the second source electrode 303, and the second drain electrode 304. The second source electrode 303 and the second drain electrode 304 may correspond to the source region and the drain region of the second active layer 301, respectively.

The second source electrode 303 of the second TFT 300 may be electrically connected to the first gate electrode 202 of the first TFT 200 via connecting electrodes 501 and 502. The connecting electrode 501 may be formed on the second insulating layer 103 and may contact a portion of the first gate electrode 202 exposed via a contact hole CH4 formed in the second insulating layer 103. The connecting electrode 502 may be formed on the sixth insulating layer 108, and may contact a portion of the connecting electrode 501 and a portion of the second source electrode 303 that are exposed via a contact hole CH5 formed in the third through sixth insulating layers 104 through 108.

The planarization layer PAV including the third insulating layer 104 and the fourth insulating layer 105 may be disposed between the first TFT 200 and the second TFT 300. The second buffer layer 106 may be disposed on the planarization layer PAV.

The third transistor T23 may be implemented using a third TFT 700. The third TFT 700 may include a third active layer 701, a third gate electrode 702, a third source electrode 703, and a third drain electrode 704. The third active layer 701 may extend from the first active layer 201. The third source electrode 703 and the third drain electrode 704 may be electrically connected to a source region and a drain region of the third active layer 701, respectively, which are exposed via the contact holes CH1. The third drain electrode 704 of the third TFT 700 may be the first drain electrode 204 of the first TFT 200.

The first capacitor C21 may be implemented using a capacitor 800 including a first electrode 801 and a second electrode 802. The first electrode 801 may be formed on a second seventh insulating layer 109b, and the second electrode 802 may be formed on a third seventh insulating layer 109c.

Each of the first electrode 801 and the second electrode 802 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and have a single-layered or a multi-layered structure. For example, each of the first and second electrodes 801 and 802 may have a three-layered structure of Ti/Al/Ti.

The second capacitor C22 may be implemented by using the first gate electrode 202 and the conductive layer 400 as the first and second electrodes, respectively.

The first source electrode 203 of the first TFT 200 may be electrically connected to a first power line 901 that applies the first power supply voltage ELVDD. The first power line 901 may be formed on a first seventh insulating layer 109a, and may contact a portion of the first source electrode 203 exposed via a contact hole CH6 formed in the third through first seventh insulating layers 104 through 109a.

The first drain electrode 204 of the first TFT 200 and the third drain electrode 704 of the third TFT 700 may be electrically connected to the second electrode 802 of the first capacitor C21 via a contact hole CH7 formed in the third through third seventh insulating layers 104 through 109c.

The second drain electrode 304 of the second TFT 300 may be electrically connected to the second electrode 802 of the first capacitor C21 via a contact hole CH8 formed in the fifth through third seventh insulating layers 107 through 109c.

The third gate electrode 702 of the third TFT 700 may be electrically connected to a control line 902 by using a connecting electrode 503. The connecting electrode 503 may be formed on the second insulating layer 103, and may contact a portion of the third gate electrode 702 exposed via a contact hole CH9 formed in the second insulating layer 103. The control line 902 may be formed on the sixth insulating layer 108, and may contact a portion of the connecting electrode 503 exposed via a contact hole CH10 formed in the third through sixth insulating layers 104 through 108.

The third source electrode 703 of the third TFT 700 may be electrically connected to a second power line 903 that applies the initializing voltage VINT, by using a connecting electrode 504. The connecting electrode 504 may be formed on the sixth insulating layer 108, and may contact a portion of the third source electrode 703 exposed via a contact hole CH11 formed in the third through sixth insulating layers 104 through 108. The second power line 903 may be formed on the first seventh insulating layer 109a, and may contact a portion of the connecting electrode 504 exposed via a contact hole CH12 formed in the first seventh insulating layer 109a.

An eighth insulating layer 110 may be disposed on the third seventh insulating layer 109c to cover the capacitor 800. The eighth insulating layer 110 may include a via hole VIA that exposes a portion of the second electrode 802 of the capacitor 800.

The display element 600 (display element ED in FIG. 13) may be disposed on the eighth insulating layer 110. The display element 600 may include the first electrode 601, the second electrode 603 opposite to the first electrode 601, and the intermediate layer 602 disposed between the first electrode 601 and the second electrode 603.

The first seventh insulating layer 109a, the second seventh insulating layer 109b, and the third seventh insulating layer 109c may include at least one inorganic insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure. According to another exemplary embodiment, the first seventh insulating layer 109a, the second seventh insulating layer 109b, and the third seventh insulating layer 109c may include at least one organic insulating material of a commercial polymer (such as PMMA or PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like, and have a single-layered or a multi-layered structure.

The connecting electrodes 501 through 504, the first power line 901, the control line 902, and the second power line 903 may each include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and each have a single-layered or a multi-layered structure.

A second pixel PX2b of FIG. 15 is different from the second pixel PX2a of FIG. 14 in that a planarization layer is formed on an insulating layer between the second TFT 300 and the display element 600. Hereinafter, the differences between the second pixel PX2b of FIG. 15 and the second pixel PX2a of FIG. 14 will mainly be described. Although not particularly shown, the second pixel PX2b of FIG. 15 according to an exemplary embodiment may include the first TFT 200 and the second TFT 300 of the semiconductor device 10a shown in FIG. 1A.

Referring to FIG. 15, a first insulating layer and a second insulating layer may be sequentially stacked on the first seventh insulating layer 109a, and then a portion of the second insulating layer may be removed to expose an upper surface of the first insulating layer, thereby forming a planarization layer including a first second seventh insulating layer 109b1 and a second second seventh insulating layer 109b2. While the second insulating layer is being removed, a portion of the first insulating layer may also be removed.

The second insulating layer may be removed by any of various etching processes. For example, an etching process may include dry etching or a polishing process, such as CMP.

The second second seventh insulating layer 109b2 may be disposed on the first second seventh insulating layer 109b1, and an upper surface of the first second seventh insulating layer 109b1 and an upper surface of the second second seventh insulating layer 109b2 may be substantially flush with each other, thereby forming an entirely-flat upper surface.

A third buffer layer 109b3 may be disposed on the first second seventh insulating layer 109b1 and the second second seventh insulating layer 109b2. The first capacitor 800 may be disposed on the third buffer layer 109b3.

As a plurality of lines that constitute a pixel are arranged on a plurality of layers, a step difference between the insulating layers may be increased. As in the illustrated exemplary embodiment of FIG. 15, an excessive step difference between a plurality of insulating layers, due to lower lines and/or electrodes, may be reduced by including a planarization layer in between the insulating layers, which may improve the coverage of a layer and/or line to be formed on the planarization layer.

The first second seventh insulating layer 109b1 and the second second seventh insulating layer 109b2 may include at least one inorganic insulating material of $SiO_x$, $SiN_x$, SiON, $Al_2O_3$, $TiO_2$, $Ta_2O_5$, $HfO_2$, $ZrO_2$, BST, and PZT, and have a single-layered or a multi-layered structure. According to another exemplary embodiment, the first second seventh insulating layer 109b1 and the second second seventh insulating layer 109b2 may include at least one organic insulating material of a commercial polymer (such as PMMA or PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like, and have a single-layered or a multi-layered structure.

A material used to form the second second seventh insulating layer 109b2 may be different from that used to form the first second seventh insulating layer 109b1. A material used to form the second second seventh insulating layer 109b2 may be different from that used to form an upper portion of the first second seventh insulating layer 109b1. For example, the first second seventh insulating layer 109b1 may be an insulating layer including $SiO_x$, or a multi-layer of a lower insulating layer including $SiO_x$ and an upper insulating layer including $SiN_x$. The second second seventh insulating layer 109b2 may be an insulating layer including $SiO_x$.

The third buffer layer 109b3 may include at least one insulating material of $SiO_x$, $SiN_x$, SiON, $Al_2O_3$, $TiO_2$, Ta₂O₅, HfO₂, ZrO₂, BST, and PZT, and have a single-layered or a multi-layered structure. For example, the third buffer layer 109b3 may be an insulating layer including SiN$_x$.

According to an exemplary embodiment, the third buffer layer 109b3, and a planarization layer of the first second seventh insulating layer 109b1 and the second second seventh insulating layer 109b2 may optionally undergo thermal treatment. The thermal treatment may include dehydrogenation treatment.

FIG. 15 shows that two planarization layers are formed. However, the inventive concepts are not limited thereto, and more than two planarization layers may be formed according to positions or arrangements of lines and/or electrodes that constitute a pixel.

In the illustrated exemplary embodiments of FIGS. 12, 14, and 15, the conductive layer 400 is disposed below the second TFT 300, as an electrode of the capacitors C11 and C22, to which a constant power supply voltage is applied. However, the inventive concepts are not limited thereto. For example, the conductive layer 400 may be a line and/or electrode, to which a constant DC voltage is applied during at least one of a threshold voltage compensating time period, a data write time period, and a light-emitting time period within a pixel driving time period.

According to exemplary embodiments, display apparatuses may be capable of realizing high-resolution by the above described arrangement of the elements of TFTs within a pixel. Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a first thin film transistor comprising a first active layer and a first electrode;
a second thin film transistor disposed on the first thin film transistor and comprising a second active layer and a first electrode; and
a conductive layer disposed between the first thin film transistor and the second thin film transistor and overlapping the first electrode of the first thin film transistor,
wherein a material of the first active layer is different from a material of the second active layer,
wherein a channel area of the second active layer overlaps a channel area of the first active layer, and
wherein a voltage applied to the conductive layer is different from a voltage applied to the first electrode of the first thin film transistor.

2. The display apparatus of claim 1, wherein one of the first active layer and the second active layer comprises an inorganic semiconductor material, and the other of the first active layer and the second active layer comprises an oxide semiconductor or an organic semiconductor material.

3. The display apparatus of claim 2, wherein the inorganic semiconductor material comprises amorphous silicon or crystalline silicon.

4. The display apparatus of claim 1, wherein each of the first thin film transistor and the second thin film transistor further comprises a second electrode and a third electrode,
wherein the first electrode of first thin film transistor is overlapped with the channel area of the first thin film transistor, and the first electrode of second thin film transistor is overlapped with the channel area of the second thin film transistor, and
wherein a layer comprising the second electrode and the third electrode is different from a layer comprising the first electrode.

5. The display apparatus of claim 4, wherein the first electrode of the second thin film transistor overlaps the first electrode of the first thin film transistor.

6. The display apparatus of claim 4, wherein a size of the first electrode of the first thin film transistor is larger than a size of the first electrode of the second thin film transistor.

7. The display apparatus of claim 1, wherein a size of the conductive layer is greater than a size of the first electrode of the second thin film transistor.

8. The display apparatus of claim 1, further comprising at least one inorganic insulating layer disposed between the first thin film transistor and the second thin film transistor.

9. The display apparatus of claim 1, further comprising a display element disposed on the second thin film transistor, the display element electrically connected to the first thin film transistor and/or the second thin film transistor.

10. The display apparatus of claim 1, wherein the first thin film transistor comprises the first electrode insulated from the first active layer, a second electrode, and a third electrode electrically connected to the first active layer, and
wherein the second thin film transistor comprises the first electrode insulated from the second active layer, a fifth electrode, and a sixth electrode electrically connected to the second active layer.

11. The display apparatus of claim 10, wherein a layer comprising the second electrode and the third electrode is different from a layer comprising the fifth electrode and the sixth electrode.

12. A display apparatus comprising:
a first thin film transistor comprising a first active layer and a first electrode;
a second thin film transistor disposed on the first thin film transistor and comprising a second active layer and a first electrode; and
a conductive layer disposed between the first thin film transistor and the second thin film transistor and overlapping the first electrode of the first thin film transistor,
wherein a material of the first active layer is different from a material of the second active layer,
wherein a channel area of the second active layer overlaps a channel area of the first active layer,
wherein the conductive layer is insulated from the first electrode of the first thin film transistor, and
wherein a center of the first electrode of the second thin film transistor aligns with a center of the conductive layer.

* * * * *